United States Patent
Hittel (10) Patent No.: US 11,575,409 B2
(45) Date of Patent: Feb. 7, 2023

(54) TIME-DOMAIN REFLECTOMETER DISTANCE MEASUREMENT FOR DEVICES SHARING A COMMON BUS

(71) Applicant: Fluke Corporation, Everett, WA (US)

(72) Inventor: John Paul Hittel, Phoenix, AZ (US)

(73) Assignee: Fluke Corporation, Everett, WA (US)

( * ) Notice: Subject to any disclaimer, the term of this patent is extended or adjusted under 35 U.S.C. 154(b) by 193 days.

(21) Appl. No.: 17/063,250

(22) Filed: Oct. 5, 2020

(65) Prior Publication Data

US 2021/0105043 A1 Apr. 8, 2021

Related U.S. Application Data

(60) Provisional application No. 62/911,698, filed on Oct. 7, 2019.

(51) Int. Cl.
*H04B 3/46* (2015.01)
*G01R 31/11* (2006.01)

(52) U.S. Cl.
CPC .............. *H04B 3/46* (2013.01); *G01R 31/11* (2013.01)

(58) Field of Classification Search
CPC ........ H04B 3/46; H04B 10/07; H04B 10/071; H04B 10/40; H04B 17/15; H04B 17/16; H04B 3/493; H04B 10/0791; H04B 17/29; H04B 10/0779; H04B 10/0771; G01R 31/11; G01R 27/06; G01R 31/58; G01R 35/005; G01R 31/1272; G01R 31/08; G01R 31/083
See application file for complete search history.

(56) References Cited

U.S. PATENT DOCUMENTS

| 5,751,149 A * | 5/1998 | Oberg | G01R 27/06 324/533 |
|---|---|---|---|
| 6,018,247 A | 1/2000 | Kelly | |
| 6,107,807 A | 8/2000 | Fluhrer | |
| 7,898,977 B2 | 3/2011 | Roese et al. | |

(Continued)

FOREIGN PATENT DOCUMENTS

EP 1193890 A2 4/2002

OTHER PUBLICATIONS

B&B Electronics Manufacturing Company, "RS-422 and RS-485 Application Note", Jun. 2006, 43 pages.

(Continued)

*Primary Examiner* — Khanh C Tran
(74) *Attorney, Agent, or Firm* — Seed IP Law Group LLP (57) ABSTRACT

A time-domain reflectometer and a distance measurement method for devices sharing a common bus are provided. The time-domain reflectometer determines a time when to transmit a first ranging signal over a cable based at least in part on when a device presents a first impedance on the cable that is lower than a second impedance of the cable. The time-domain reflectometer transmits the first ranging signal over the cable and in response to transmitting the first ranging signal, receives, over the cable, a first response signal having a peak associated with an impedance mismatch present on the cable resulting from the device presenting the first impedance on the cable. The time-domain reflectometer determines, based on the first response signal, a distance between the time-domain reflectometer and the device.

20 Claims, 6 Drawing Sheets

(56) References Cited

U.S. PATENT DOCUMENTS

| | | | | |
|---|---|---|---|---|
| 9,414,126 B1* | 8/2016 | Zinevich | ............... | H04B 3/46 |
| 2002/0070784 A1* | 6/2002 | Falconer | ............... | H03H 11/30 |
| | | | | 327/281 |
| 2002/0118042 A1* | 8/2002 | Helt | ............... | H03K 19/00384 |
| | | | | 326/86 |
| 2004/0232919 A1 | 11/2004 | Lacey | | |
| 2004/0251912 A1* | 12/2004 | Pharn | ............... | G01R 31/11 |
| | | | | 324/534 |
| 2005/0052190 A1* | 3/2005 | McCosh | ............... | G01B 11/024 |
| | | | | 324/644 |
| 2006/0067239 A1 | 3/2006 | Olinski | | |
| 2010/0073014 A1* | 3/2010 | Maslen | ............... | G01R 31/11 |
| | | | | 324/649 |
| 2011/0043244 A1* | 2/2011 | Hall | ............... | G01R 31/11 |
| | | | | 324/764.01 |
| 2011/0291661 A1 | 12/2011 | Stokes | | |
| 2014/0222356 A1 | 8/2014 | Incarbone | | |
| 2015/0236643 A1 | 8/2015 | Khan et al. | | |
| 2017/0104522 A1* | 4/2017 | Zinevich | ............... | H04B 10/071 |
| 2017/0176511 A1 | 6/2017 | Moell et al. | | |
| 2019/0086466 A1 | 3/2019 | Broeckmann | | |
| 2019/0113900 A1 | 4/2019 | Yoscovich et al. | | |

OTHER PUBLICATIONS

Thomas Kugelstadt, "The RS-485 Design Guide", Texas Instruments, Feb. 2008, 10 pages.
George Zimmerman et al., "IEEE P802.3cg 10 Mb/s Single Pair Ethernet: A guide", Jan. 16, 2019, 40 pages.
International Search Report and Written Opinion for Application No. PCT/US2020/054300, dated Dec. 18, 2020, 12 pages.

\* cited by examiner

TIME-DOMAIN REFLECTOMETER DISTANCE MEASUREMENT FOR DEVICES SHARING A COMMON BUS

BACKGROUND

Technical Field

This application is directed to a time-domain reflectometer and, in particular, a time-domain reflectometer that measures distance to devices sharing a common bus.

Description of the Related Art

Daisy-chained busses having multiple devices connected to a single shared cable for communications are commonly used. The Telecommunications Industry Association and Electronic Industries Alliance (TIA/EIA) 485 standard (also known as a Recommended Standard (RS)-485) is a common and inexpensive way to network many devices together over a cable that may be thousands of feet in length. The cable may include a single pair that is shared with devices taking turns transmitting on that pair. Similarly, the RS-422 standard allows for the use of two pairs. In addition, the Single Pair Ethernet standard (also referred to as 802.3cg) delivers 10 megabits per second (MBPS) over a single pair to multiple devices.

Because devices may be daisy-chained on a bus, it is possible for one failing device to render the entire bus inoperative. Because busses are potentially long, it can be difficult to find a specific device by looking along the bus. In troubleshooting, there is a need for technicians to find devices connected to the bus.

BRIEF SUMMARY

In an embodiment, a time-domain reflectometer includes a transceiver configured to transmit a first ranging signal over a cable, in response to transmitting the first ranging signal, receive, over the cable, a first response signal having a peak associated with an impedance mismatch present on the cable resulting from a device presenting a first impedance on the cable that is lower than a second impedance of the cable and output data representative of the first response signal. The time-domain reflectometer includes a processor configured to determine a time when to transmit the first ranging signal over a cable based at least in part on when the device presents the first impedance on the cable, output, based on the time when to transmit the first ranging signal, a command instructing the transceiver to transmit the first ranging signal, receive the data representative of the first response signal, determine, based on the data representative of the first response signal, a distance between the time-domain reflectometer and the device and output data representative of the distance.

In an embodiment, the processor is configured to output a command instructing the transceiver to transmit a second ranging signal at a time when a plurality of devices connected to the cable do not present a lower impedance on the cable, in response to transmitting the second ranging signal, receive data representative of a second response signal that is a baseline impedance signal and determine the distance based on the data representative of the first and second response signals.

In an embodiment, the processor is configured to determine the distance between the time-domain reflectometer and the device based on the data representative of the second response signal by at least obtaining a difference between the first response signal and the second response signal and determining the distance based on the difference between the first response signal and the second response signal. In an embodiment, the first ranging signal is a sequence that is a pseudo random sequence or a maximum length sequence.

In an embodiment, the processor is configured to perform correlation on the first response signal to produce a correlation signal and determine the distance between the time-domain reflectometer and the device based on the correlation signal. In an embodiment, the processor is configured to determine the distance between the time-domain reflectometer and the device based on the correlation signal by at least identifying a peak in the correlation signal and a time instance associated with the peak and determining the distance based on the time instance associated with the peak.

In an embodiment, the processor is configured to obtain one or more other correlation signals by performing respective one or more correlations on one or more other response signals, obtain a function of the correlation signal and the one or more other correlation signals and determine the distance between the time-domain reflectometer and the device based on the function of the correlation signal and the one or more other correlation signals. In an embodiment, the function is an average of the correlation signal and the one or more other correlation signals or a sum of the correlation signal and the one or more other correlation signals.

In an embodiment, a method includes determining, by a time-domain reflectometer, a time when to transmit a first ranging signal over a cable based at least in part on when a device presents a first impedance on the cable that is lower than a second impedance of the cable, transmitting the first ranging signal over the cable, in response to transmitting the first ranging signal, receiving, over the cable, a first response signal having a peak associated with an impedance mismatch present on the cable resulting from the device presenting the first impedance on the cable and determining, based on the first response signal, a distance between the time-domain reflectometer and the device.

In an embodiment, a method includes transmitting a second ranging signal at a time when a plurality of devices, including the device, connected to the cable do not present a lower impedance on the cable, in response to transmitting the second ranging signal, receiving a second response signal that is a baseline impedance and determining the distance based on the first and second response signals. In an embodiment, determining the distance between the time-domain reflectometer and the device based on the second response signal includes obtaining a difference between the first response signal and the second response signal and determining the distance based on the difference between the first response signal and the second response signal. In an embodiment, the first ranging signal is a sequence that is a pseudo random sequence or a maximum length sequence.

In an embodiment, a method includes performing correlation on the first response signal to produce a correlation signal and determining the distance between the time-domain reflectometer and the device based on the correlation signal. In an embodiment, determining the distance between the time-domain reflectometer and the device based on the correlation signal includes identifying a peak in the correlation signal and a time instance associated with the peak and determining the distance based on the time instance associated with the peak.

In an embodiment, a method includes obtaining one or more other correlation signals by performing respective one or more correlations on one or more other response signals, obtaining a function of the correlation signal and the one or more other correlation signals and determining the distance between the time-domain reflectometer and the device based on the function of the correlation signal and the one or more other correlation signals. In an embodiment, the function is an average of the correlation signal and the one or more other correlation signals or a sum of the correlation signal and the one or more other correlation signals.

In an embodiment, a non-transitory computer-readable storage medium has stored thereon executable instructions that, when executed by a processor, cause the processor to determine a time when to transmit a first ranging signal over a cable based at least in part on when a device, connected to the cable, presents a first impedance on the cable that is lower than a second impedance of the cable, cause the first ranging signal to be transmitted in accordance with the time, receive data representative of a first response signal having a peak associated with an impedance mismatch present on the cable resulting from the device presenting the first impedance on the cable that is lower than the second impedance of the cable, determine, based on the data representative of the first response signal, a distance between a time-domain reflectometer and the device and output data representative of the distance.

In an embodiment, the executable instructions cause the processor to cause a second ranging signal to be transmitted at a time when a plurality of devices, including the device, connected to the cable do not present a lower impedance on the cable, in response to causing the second ranging signal to be transmitted, receive a second response signal that is a baseline impedance and determine the distance based on the first and second response signals. In an embodiment, the executable instructions cause the processor to obtain a difference between the first response signal and the second response signal and determine the distance based on the difference between the first response signal and the second response signal.

DETAILED DESCRIPTION

Figure 1:
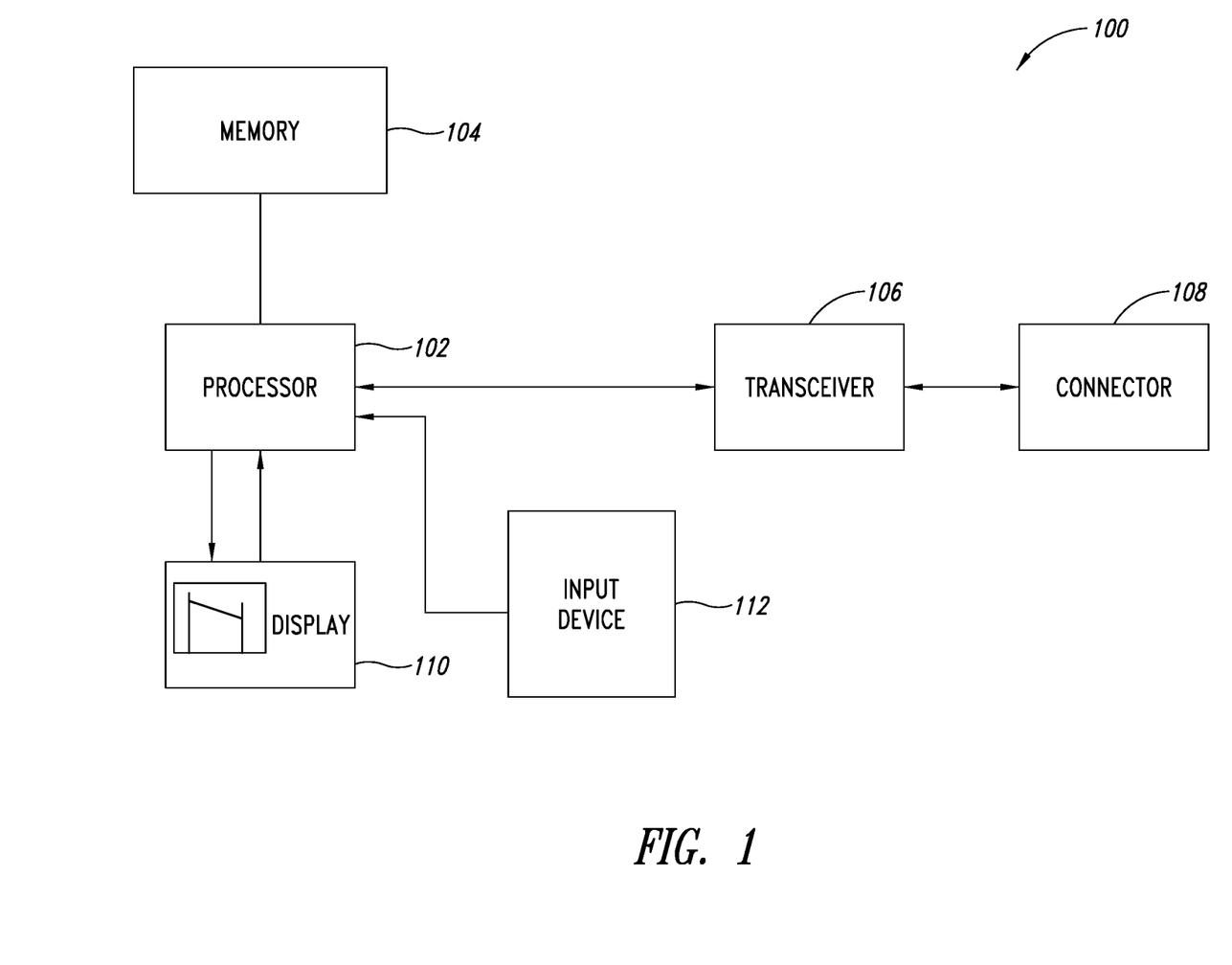
FIG. 1 shows a block diagram of a time-domain reflectometer (TDR) in accordance with an embodiment.

FIG. 1 shows a block diagram of a time-domain reflectometer (TDR) 100 in accordance with an embodiment. The time-domain reflectometer 100 includes a processor 102, memory 104, a transceiver 106, a connector 108, a display 110 and an input device 112. The processor 102 is operatively coupled to the memory 104, transceiver 106, display 110 and input device 112. The transceiver 106 is coupled to the connector.

The processor 102 may be any type of device that is configured to execute instructions (computer-executable instructions) that cause the processor 102 to operate as described herein. For example, the processor may be a controller or a microcontroller and may include a central processing unit (CPU) or any other type of processing unit. The memory 104 may be any type of non-transitory computer-readable storage medium. The memory 104 may be read-only memory (ROM) or random access memory (RAM), among others. Further, the memory 104 may be static or dynamic. The memory 104 stores the computer-executable instructions that may be retrieved or accessed by the processor 102 for execution. The computer-executable instructions, when executed by the processor 102, cause the processor 102 (and the time-domain reflectometer 100) to operate as described herein.

The transceiver 106 may be any type of device having transmitter and receiver capability and configured to transmit and receive signals over a cable. Although one transceiver 106 is shown in FIG. 1, the time-domain reflectometer 100 may include multiple transceivers, one or more transmitters or one or more receivers. The time-domain reflectometer 100 may also include separate transmitter and receiver devices in place of the transceiver 106. The transceiver 106 may receive a command from the processor to transmit a ranging signal for testing a cable. In response to receiving the command, the transceiver 106 may generate and output the ranging signal. The command, which may be a trigger signal, may specify a type of the ranging signal (e.g., whether the ranging signal is a pulse or a sequence), and the transceiver 106 may generate and output the ranging signal in accordance with the command.

The transceiver 106 receives a reflection signal that is reflected by the cable, which may be a common bus shared by a plurality of devices. The reflection signal is used, as described herein, to perform ranging and find a distance along the cable between the time-domain reflectometer 100 and a device. The transceiver 106 outputs, to the processor 102, data representative of the response signal.

The connector 108 may be any type of electrical connector operative to connect the transceiver 106 to a cable (not shown). The connector 108 may connect to any type of cable configuration, such as a single twisted pair or multiple twisted pairs. For example, the connector 108 may connect the transceiver 106 to a Telecommunications Industry Association and Electronic Industries Alliance (TIA/EIA) 485 cable (also known as a Recommended Standard (RS)-485 cable).

The display 110 may be any type of visual output device configured to output data to a user. The display 110 may be a screen that is configured to display a TDR trace that is generated by the processor 102 based on the response signal or a distance between the time-domain reflectometer 100 and a device.

The input device 112 may be any type of device configured to receive user input. The input device 112 may be a keypad or buttons, among others. In an embodiment, the input device 112 and the display 110 may be a touchscreen operative to both display data to a user and receive user input. A user may use the input device 112 to control the time-domain reflectometer 100 and functionality thereof. The time-domain reflectometer 100 may include one or more wired or wireless communication interfaces configured to communicate with an external device. For example, the one or more wired or wireless communication interfaces may be a modem or transceiver. The one or more wired or wireless communication interfaces may communicate with the external device and may send test results to the external device.

The processor 102 outputs a command to the transceiver 106 that instructs the transceiver 106 to transmit the ranging signal. The command may specify properties of the ranging signal. The command may specify whether the ranging signal is a pulse signal (i.e., a positive pulse or a negative pulse), a pseudorandom signal or a maximum length sequence (MLS) signal. The properties may include a power associated with the ranging signal and a shape or form of the ranging signal. For example, the shape or form may include a step function or an impulse function. The properties may also include a pulse width of the ranging signal.

After transmitting the ranging signal, the transceiver 106 receives a response signal representative of a reflection of the ranging signal. As the ranging signal traverses a cable, impedance mismatches along the cable induce reflections in the form of the response signal. The transceiver 106 receives the response signal and outputs data representative of the response signal to the processor 102.

The processor 102 receives the data representative of the response signal. The processor 102 may operate on the data representative of the response signal as described herein and generate, based on the data representative of the response signal, a TDR trace. The processor 102 causes the TDR trace to be displayed on the display 110. As described herein, the processor 102 may determine, based on the data representative of the response signal, a distance between the time-domain reflectometer 100 and a device connected to the cable. The processor 102 may output data representative of the distance to the display 110 or may communicate the distance information to an external system, such as a smartphone, personal computer, remote server, cloud-based computer, etc. The display 110 receives the data from the processor 102 and displays the TDR trace and/or the distance.

Figure 2:
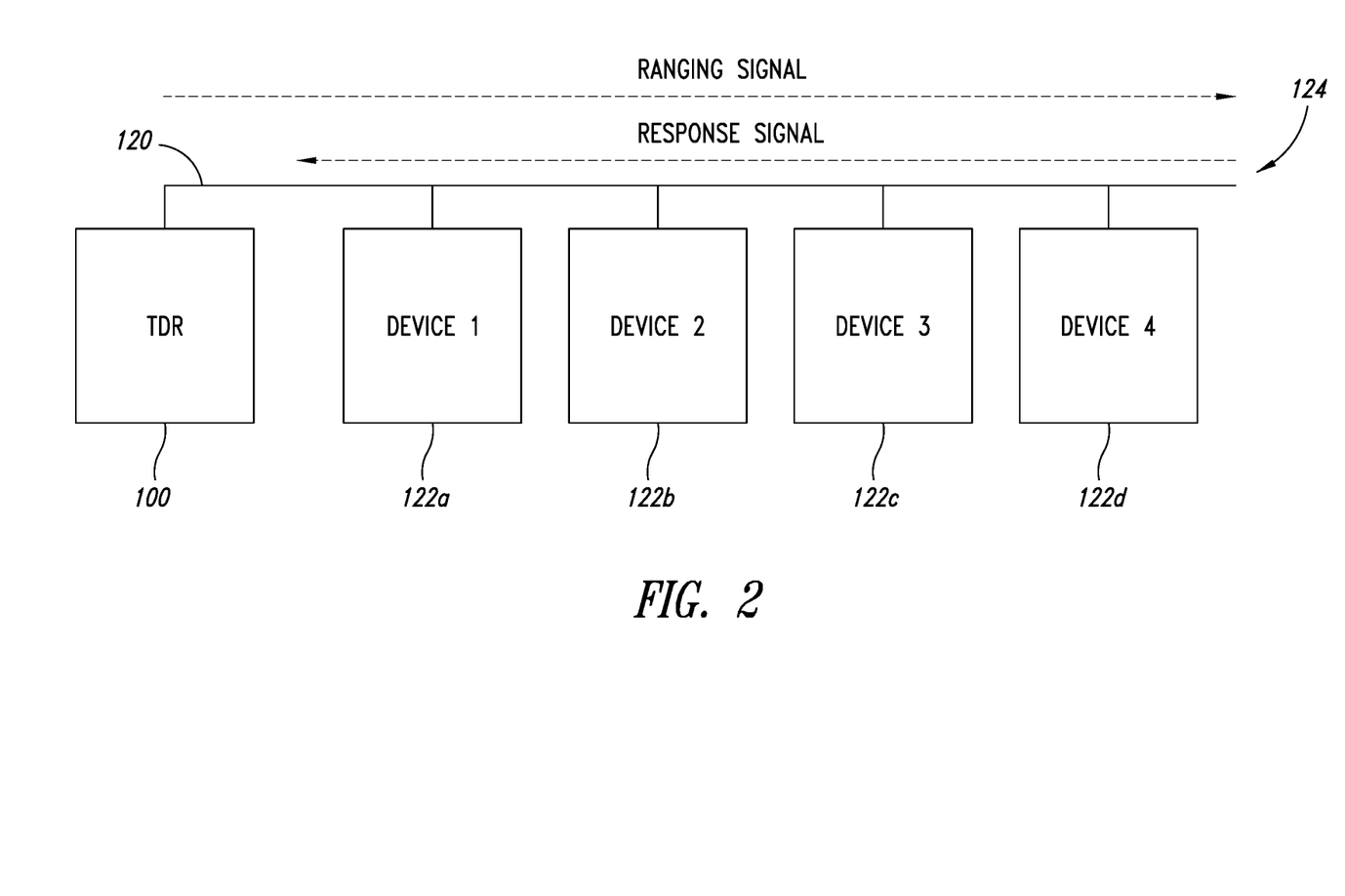
FIG. 2 shows a testing environment for the time-domain reflectometer.

FIG. 2 shows a testing environment for the time-domain reflectometer 100. The environment includes the time-domain reflectometer 100, a cable 120 and a plurality of devices 122a-d (collectively referred to hereinafter by the numeral alone). Although four devices 122 (including a first device 122a, a second device 122b, a third device 122c and a fourth device 122d) are shown, the plurality of devices 122 may include any number of devices.

The time-domain reflectometer 100 and the plurality of devices 122 are coupled to the cable 120. Even though the time-domain reflectometer 100 is shown to be coupled to one end of the cable 120, the time-domain reflectometer 100 may be coupled to the cable 120 at any point along the cable 120. The cable 120 is shown in FIG. 2 to have an end 124 that may be terminated or unterminated.

The cable 120 may be an RS-485 or RS-422 cable, for example. The cable 120 may be in accordance with the Institute of Electrical and Electronics Engineers (IEEE) 802.3cg standard (also referred to as Single Pair Ethernet), among others. The cable 120 may include one twisted pair of conductors or more than one twisted pair, among other types of conductors. The plurality of devices 122 may be coupled to the cable 120 in a daisy-chain configuration and may take turns transmitting signals on the cable 120 (or twisted pair thereof) in a round-robin fashion. The plurality of devices 122 may non-simultaneously transmit signals on the twisted pair.

The time-domain reflectometer 100 may determine a distance along the cable (or a cable length) between the time-domain reflectometer 100 and a device of the plurality of devices 122. Personnel, such as a technician, may use the distance provided by the time-domain reflectometer 100 to locate the device, for example, in an area, a building or another type of structure or environment. The cable 120 may connect the devices 122 in a variety of environments including connecting building access control card readers, lighting equipment in theaters and performance venues and devices in aircraft cabins, among others.

A device 122 connected to the cable 120 may malfunction. For example, the malfunctioning device 122 may continually transmit signals over the cable 120 thereby occupying the cable 120 and preventing other devices 122 from using the cable to communicate. In this instance and other instances, it is desirable for the device 122 to the identified, e.g., so it can be repaired or replaced. The time-domain reflectometer 100 may output a distance that usable to identify the device 122. A technician may read the distance provided by time-domain reflectometer 100 and trace the distance along the cable to locate the device. Alternatively, a technician may locate the device using the distance with the aid of a blueprint.

Typically, the cable 120 has a uniform impedance and lacks significant impedance mismatches. Accordingly, the response signal, received in response to transmitting the ranging signal, may not have significant peaks and/or valleys that are induced by an impedance mismatch. However, when a device 122 transmits data on the cable 120, the device 122 presents a low impedance driver on the cable 120 having an impedance that is lower than the impedance of the cable 120 or lower than the impedance of the other devices on the cable 120. The device 122 presents the low impedance driver on the cable 120 not only when the device 122 is actively transmitting but also during an idle period prior to beginning active transmission and after the active transmission ends. To transmit data on the cable 120, the device 122 may initially present the low impedance driver on the cable at which point the device 122 may be said to be "holding the bus." After the active transmission, the device 122 may continue to hold the bus. The device 122 may present the low impedance driver and hold the bus for a period of time that is the duration of the idle period. Before and after actively transmitting and during the idle period, neither the device 122 nor other devices 122 connected to the cable 120 may be actively transmitting.

As described herein, the time-domain reflectometer 100 may transmit the ranging signal during the idle period advantageously ensuring that the ranging signal does not interfere with transmission by the devices 122 connected to the cable 120 and vice-versa. As described herein, when a device 122 presents low impedance on the cable 120, the response signal has a peak (or generally a maximum or minimum) corresponding to the low impedance. The peak has a location (in time) corresponding to a distance between the time-domain reflectometer 100 and the device 122.

Figure 3:
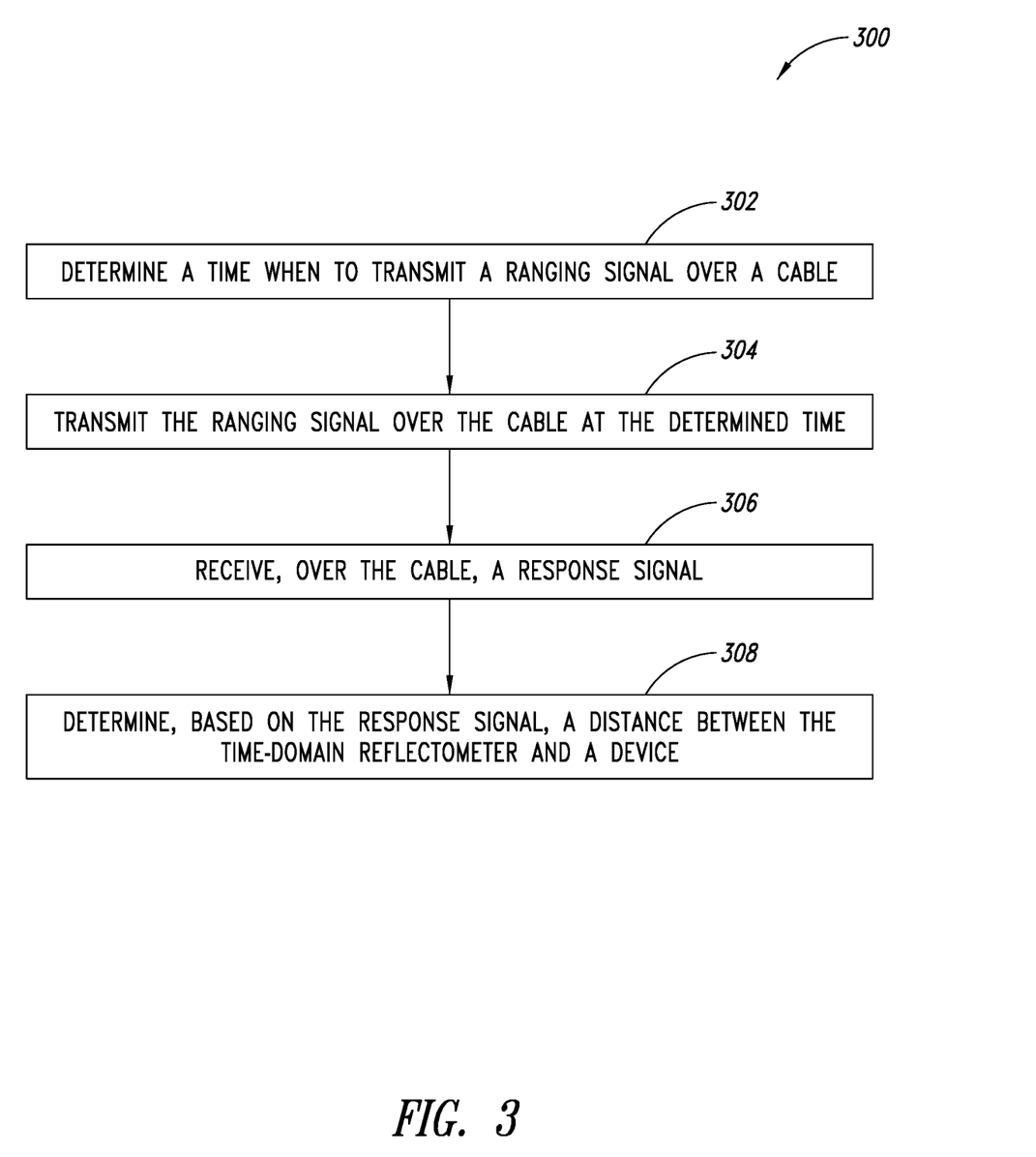
FIG. 3 shows a flow diagram of a method for determining a distance between the time-domain reflectometer and a device connected to a cable.

FIG. 3 shows a flow diagram of a method 300 for determining a distance between the time-domain reflectometer 100 and a device 122 connected to a cable 120. In the method 300, the time-domain reflectometer 100, at 302, determines a time when to transmit a ranging signal over a cable. The time may be determined to coincide with an idle period during which the device 122 "holds the bus" but before the device 122 begins transmitting on the cable 120 or after the device 122 finishes transmitting on the cable 120. The time-domain reflectometer 100 may identify the idle period based on monitoring and evaluating communications by the devices 122 that take place over the cable 120. The time-domain reflectometer 100 may monitor the communications based on knowledge of the communications protocol used by the devices. For example, the time-domain reflectometer 100 may monitor communications over the cable 120 and determine that an identifier (for example, an address) of the device 122 was included in the communications. Data transmitted by the device 122 may include an identifier of the device, for example, in a packet header. The presence of the identifier of the device 122 may be an indication that the device 122 is presently transmitting data and may imminently finish transmitting the data. The presence of the identifier of the device 122 may be an indication that the device 122 received a request to transmit data and may imminently begin transmitting data. Accordingly, the time-domain reflectometer 100, with knowledge of the communications protocol, may determine when the idle period begins and, accordingly, when to transmit the ranging signal. The time-domain reflectometer 100 may additionally parse the communications over the cable 120 to identify a request for transmission, a header or payload data, among others.

The time-domain reflectometer 100 may determine the time when to transmit the ranging signal to coincide with a period of time during which the device 122 is transmitting data but the data does not transition between states. The time may coincide with a period of time during which the device 122 is transmitting a string of two or more logical zeros or two or more logical ones. When the device 122 is transmitting a string of identical bits, the device 122 may not be inputting interference on the cable 120. Accordingly, communication over the cable 120 may be deemed to be "quiet" (in the absence of bit transitions).

The period of time during which the device 122 is transmitting data that does not transition between states may be determined based on evaluating communications over the cable and/or properties of the communication protocol used by the device 122 communicate over the cable 120. For example, the time-domain reflectometer 100 may identify a preamble, header or payload data of a packet according to the communication protocol that includes a string of logically identical bits and a time of the string's impending transmission.

Alternatively, the time-domain reflectometer 100 may transmit the ranging signal irrespective of whether the transmission coincides with the idle period or data state transitions. The ranging signal and the response signal may coincide or interfere with transmissions by the device 122 and vice-versa. If the ranging signal or the response signal coincides with another transmission on the cable, the ranging signal or the response signal may be corrupted and, thus, less reliable for distance determination. The techniques described herein may be used to improve noise and interference immunity.

The time-domain reflectometer 100, at 304, transmits the ranging signal over the cable 120 at the determined time. In response to transmitting the ranging signal, the time-domain reflectometer 100 receives a response signal over the cable 120 at 306. The response signal may have a peak (minima or maxima) associated with an impedance mismatch present on the cable resulting from the device 122 presenting a first impedance on the cable that is lower than a second impedance of the cable 120.

The time-domain reflectometer 100, at 304, determines, based on the response signal, a distance between the time-domain reflectometer 100 and the device 122. The response signal is a time-domain signal. The response signal exhibits a peak corresponding to the impedance mismatch at a position of the device 122 on the cable. The position of the peak corresponds to a round-trip distance between the time-domain reflectometer 100 and the device 122. The time-domain reflectometer 100 may identify the peak in the response signal and may identify the distance to the device 122 based on the speed at which the ranging signal and the response signal traverse the cable 120 and the position of the peak in the time-domain response signal.

Figure 4:
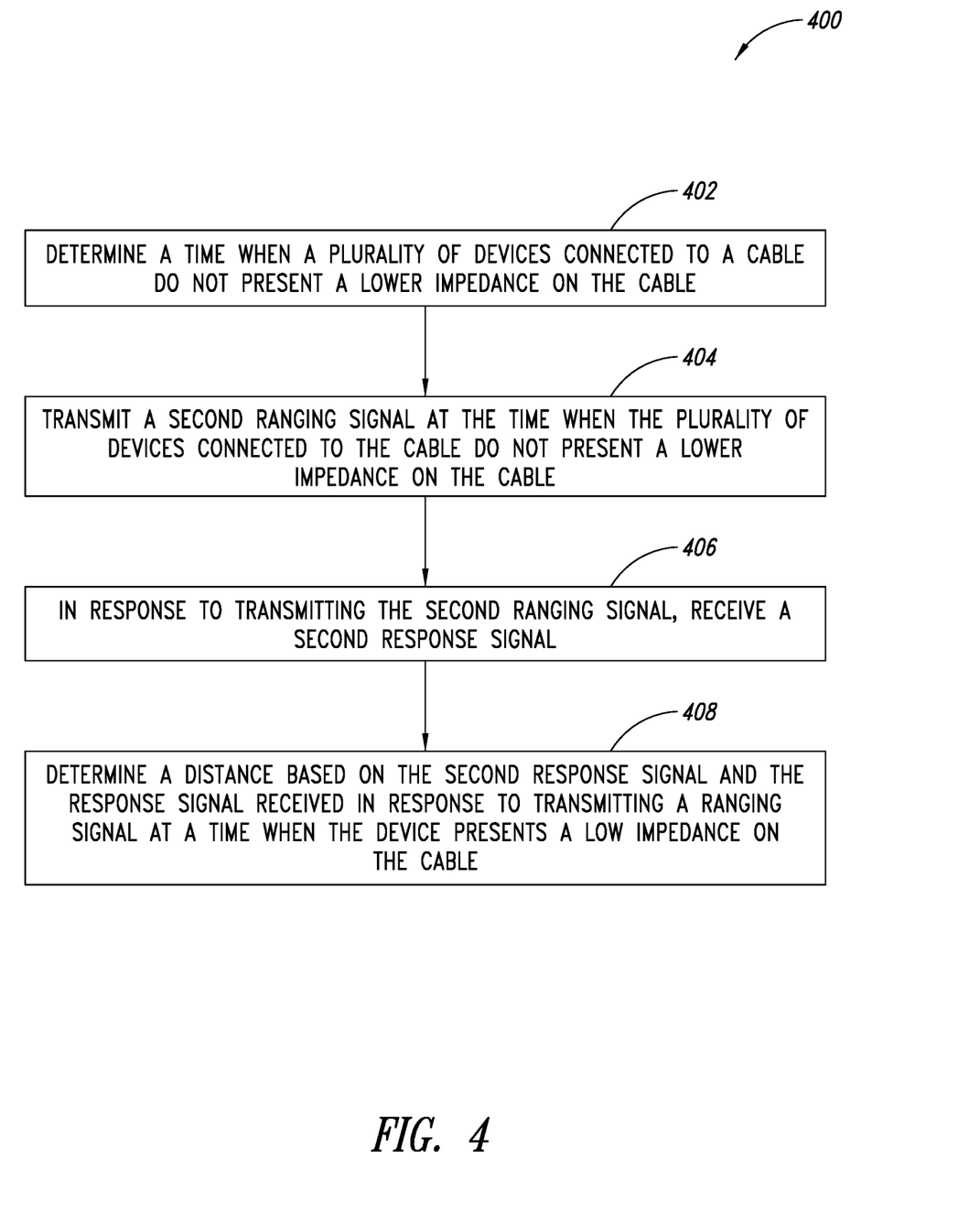
FIG. 4 shows a flow diagram of a method for determining a distance between the time-domain reflectometer and a device connected to a cable.

FIG. 4 shows a flow diagram of a method 400 for determining a distance between the time-domain reflectometer 100 and a device 122 connected to a cable 120. In the method 400, the time-domain reflectometer 100, at 402, determines a time when the plurality of devices 122 connected to the cable 120 do not present lower impedance on the cable 120. The time-domain reflectometer 100 may determine at the time based on evaluating communication or data traffic on the cable 120. During operation, there will be periods of time when the plurality of devices 122 are not transmitting or communicating over the cable 120. During the periods of time, the devices 122 do not present lower impedance on the cable 120 and may present high impedance on the cable 120. At 402, the time-domain reflectometer 100 may determine the time based on evaluating the data trafficked over the cable. The time-domain reflectometer 100 may determine that at a present time the devices 122 are not transmitting data over the cable 120.

The time-domain reflectometer 100, at 404, transmits a second ranging signal at the time when the plurality of devices connected to the cable do not present a lower impedance on the cable. At 406, in response to transmitting the second ranging signal, the time-domain reflectometer 100 receives a second response signal. The second response signal may be deemed as a baseline signal for the cable 120 or a baseline impedance for the cable 120. The second response signal may be a TDR response signal that represents a natural response of the cable 120 and may represent imperfections in the cable 120. The second response signal may represent a state of the cable when the devices 122 do not present a low impedance on the cable 120. The second response signal may be a "baseline" for the cable 120 and may be used to calibrate and remove the effects of noise and interference from the response signal.

The time-domain reflectometer 100, at 408, determines a distance between the time-domain reflectometer 100 and a device 122 based on the second response signal and the response signal received in response to transmitting a ranging signal at a time when the device 122 presents a low impedance on the cable. The time-domain reflectometer 100 may determine a difference between the response signal received in response to transmitting a ranging signal at a time when the device 122 presents a low impedance on the cable and the second response signal. By determining the difference, the time-domain reflectometer 100 removes from the response signal contributions that are due to the natural response of the cable or a structure of the cable. The contributions may be due to cable termination, nonuniformity of cable impedance, cable connections or splices, among others.

In an embodiment, the ranging signal may be a sequence, such as, a pseudo random sequence or a maximum length sequence (MLS). Due to the fact that the ranging signal is a sequence, a correlation may be performed on the ranging signal to improve peak detection. For example if the response signal is denoted as $r(n)$, the correlation signal may be represented as:

$$c(n)=\Sigma_m r(n)r(m-n).\qquad\text{Equation (1)}$$

Compared to the response signal, the correlation signal is more immune to noise and interference and has a sharper peak corresponding to a device 122 presenting a low impedance on the cable 120.

Figure 5:
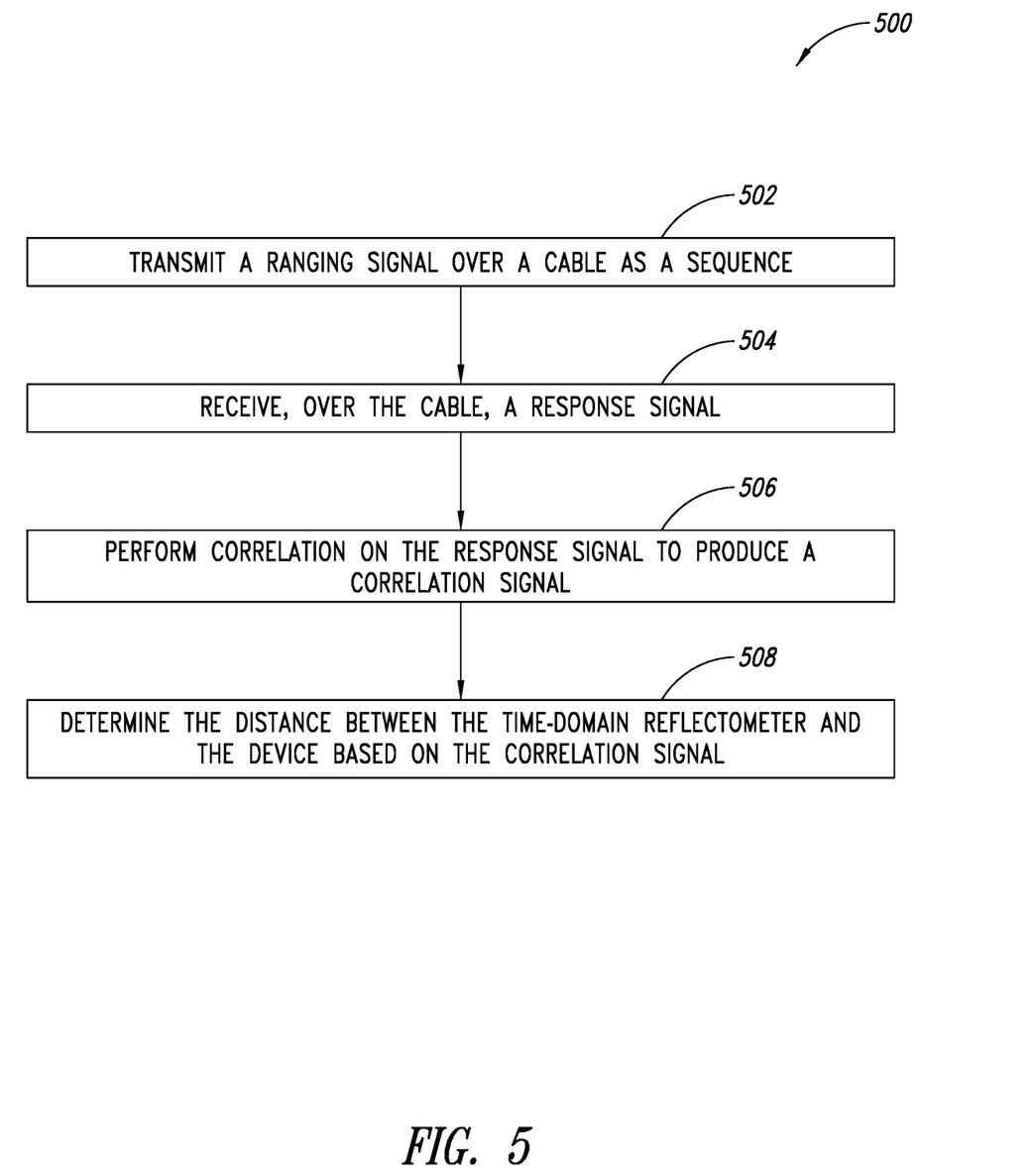
FIG. 5 shows a flow diagram of a method for determining a distance between the time-domain reflectometer and a device connected to a cable.

FIG. 5 shows a flow diagram of a method 500 for determining a distance between the time-domain reflectometer 100 and a device 122 connected to a cable 120. In the method 500, the time-domain reflectometer 100, at 502, transmits a ranging signal over the cable 120 as a sequence. As described herein, the sequence may be a pseudo random sequence or a maximum length sequence, for example. In response to transmitting the ranging signal, the time-domain reflectometer 100 receives, over the cable, a response signal at 504.

The time-domain reflectometer 100 performs correlation on the response signal to produce a correlation signal at 506. The time-domain reflectometer 100 may perform the correlation in accordance with Equation (1) described herein. The correlation signal may have a peak associated with a low impedance presented by a device 122. The time-domain reflectometer 100 at 508 determines the distance between the time-domain reflectometer and the device based on the correlation signal.

The time-domain reflectometer 100 may identify the peak and an index thereof. The index may represent a round-trip time between the time-domain reflectometer 100 and the device 122. The round-trip time may be the time it takes the sequence to travel from the time-domain reflectometer 100 to the device 122 and for the response signal to travel from the device to the time-domain reflectometer 100. Given that the speed of travel of the sequence and the response signal over the cable 120 are known, the distance between the time-domain reflectometer 100 and the device 122 may be determined.

To improve distance determination, the time-domain reflectometer 100 may send a plurality of sequences over the cable 120. The time-domain reflectometer 100 may average (or sum) a plurality of correlation signals corresponding to the plurality of sequences to produce an average correlation signal. The time-domain reflectometer 100 then determines a distance based on the average (or summed) correlation signal.

Use of the average correlation signal improves device detection and distance determination. Individual correlation signals have stronger noise immunity than their respective response signals. Averaging the correlation signals spreads noise and interference and results in improved peak detection.

Figure 6:
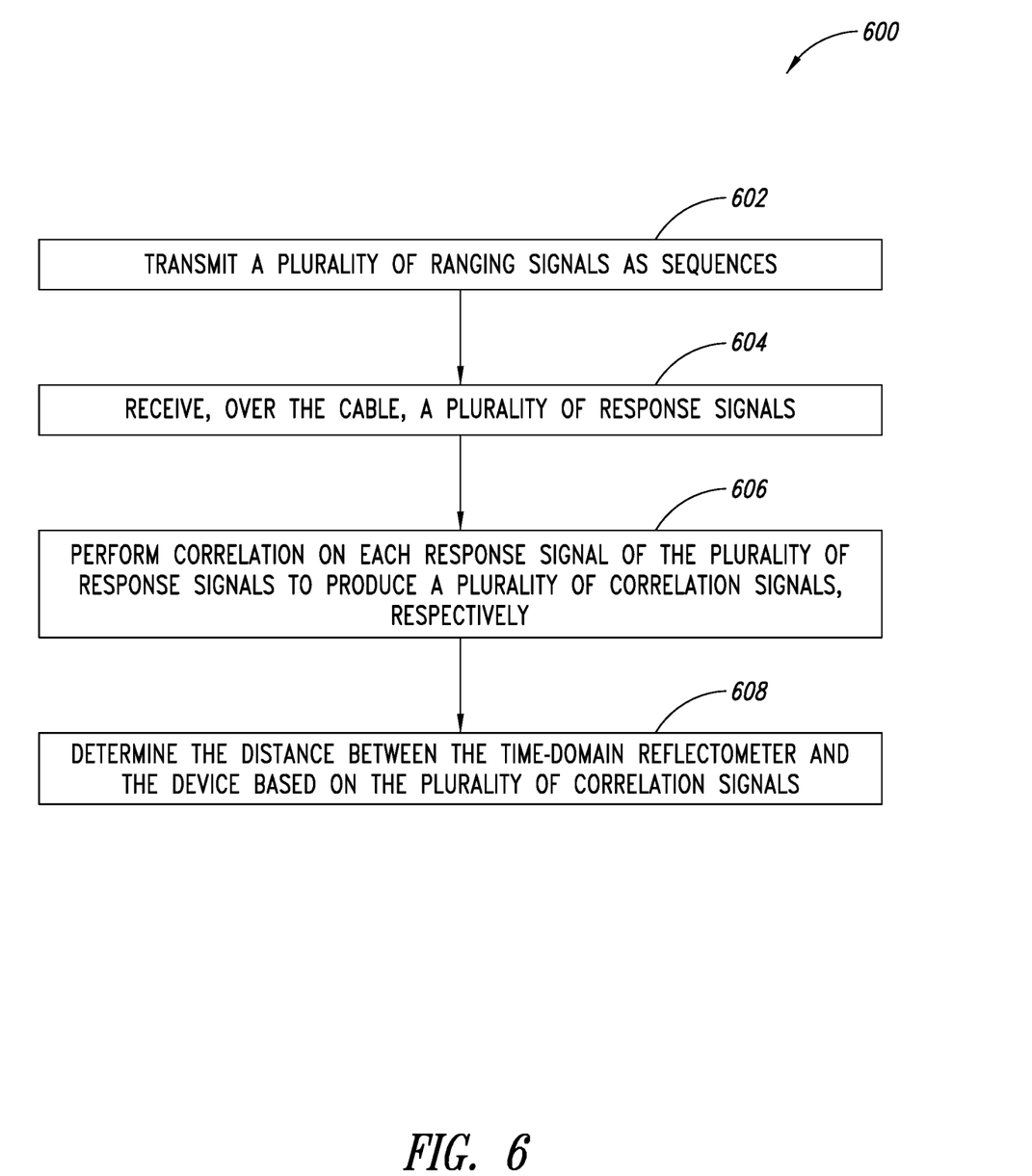
FIG. 6 shows a flow diagram of a method for determining a distance between the time-domain reflectometer and a device connected to a cable.

FIG. 6 shows a flow diagram of a method 600 for determining a distance between the time-domain reflectometer 100 and a device 122 connected to a cable 120. In the method 600, the time-domain reflectometer 100, at 602, transmit a plurality of ranging signals over the cable 120 as sequences. As described herein, each sequence may be a pseudo random sequence or a maximum length sequence. In response to transmitting the plurality of ranging signals, the time-domain reflectometer 100 receives, over the cable 120, a plurality of response signals at 604.

The time-domain reflectometer 100, at 606, performs correlation on each response signal of the plurality of response signals to produce a plurality of correlation signals, respectively. The time-domain reflectometer 100 may perform the correlation on each response signal using Equation (1) described herein. The time-domain reflectometer 100, at 608, determines the distance between the time-domain reflectometer 100 and the device 122 based on the plurality of correlation signals. The time-domain reflectometer 100 may average the plurality of correlation signals (or take any other function of the plurality of correlation signals, such as a sum, median or mode, among others). The time-domain reflectometer 100 may determine the distance based on the function of the plurality of correlation signals. For example, if an average correlation signal is obtained, the time-domain reflectometer 100 determines a distance based on the average correlation signal. As described herein, the time-domain reflectometer 100 determines the distance by identifying a peak in the average correlation signal and determining the distance based on an index associated with the peak.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A time-domain reflectometer, comprising:
 a transceiver configured to:
  transmit a first ranging signal over a cable;
  in response to transmitting the first ranging signal, receive, over the cable, a first response signal having a peak associated with an impedance mismatch present on the cable resulting from a device presenting a first impedance on the cable that is lower than a second impedance of the cable; and
  output data representative of the first response signal; and
 a processor configured to:
  determine a time when to transmit the first ranging signal over the cable that coincides with a period of time when the device both presents the first impedance on the cable and does not actively transmit data on the cable;
  output, based on the time when to transmit the first ranging signal, a command instructing the transceiver to transmit the first ranging signal;
  receive the data representative of the first response signal;
  determine, based on the data representative of the first response signal, a distance between the time-domain reflectometer and the device; and
  output data representative of the distance.

2. The time-domain reflectometer according to claim 1, wherein the processor is configured to:
 output a command instructing the transceiver to transmit a second ranging signal at a time when a plurality of devices connected to the cable do not present a lower impedance on the cable;
 in response to transmitting the second ranging signal, receive data representative of a second response signal; and
 determine a baseline impedance based on the data representative of the second response signal.

3. The time-domain reflectometer according to claim 2, wherein the processor is configured to determine the distance between the time-domain reflectometer and the device based on the baseline impedance by at least:
 obtaining a difference between the first response signal and the baseline impedance; and determining the distance based on the difference between the first response signal and the baseline impedance.

4. The time-domain reflectometer according to claim 1, wherein the first ranging signal is a sequence that is a pseudo random sequence or a maximum length sequence.

5. The time-domain reflectometer according to claim 4, wherein the processor is configured to:
perform correlation on the first response signal to produce a correlation signal; and
determine the distance between the time-domain reflectometer and the device based on the correlation signal.

6. The time-domain reflectometer according to claim 5, wherein the processor is configured to determine the distance between the time-domain reflectometer and the device based on the correlation signal by at least:
identifying a peak in the correlation signal and a time instance associated with the peak; and
determining the distance based on the time instance associated with the peak.

7. The time-domain reflectometer according to claim 5, wherein the processor is configured to:
obtain one or more other correlation signals by performing respective one or more correlations on one or more other response signals;
obtain a function of the correlation signal and the one or more other correlation signals; and
determine the distance between the time-domain reflectometer and the device based on the function of the correlation signal and the one or more other correlation signals.

8. The time-domain reflectometer according to claim 7, wherein the function is an average of the correlation signal and the one or more other correlation signals or a sum of the correlation signal and the one or more other correlation signals.

9. The time-domain reflectometer according to claim 1, wherein the device does not actively transmit data on the cable when the device:
is in an idle period before active transmission begins,
is in the idle period after the active transmission ends, or
transmits data that has the same state and does not transition between states.

10. A method, comprising:
determining, by a time-domain reflectometer, a time when to transmit a first ranging signal over a cable that coincides with a period of time when a device both presents a first impedance on the cable that is lower than a second impedance of the cable and does not actively transmit data on the cable;
transmitting the first ranging signal over the cable;
in response to transmitting the first ranging signal, receiving, over the cable, a first response signal having a peak associated with an impedance mismatch present on the cable resulting from the device presenting the first impedance on the cable; and
determining, based on the first response signal, a distance between the time-domain reflectometer and the device.

11. The method according to claim 10, comprising:
transmitting a second ranging signal at a time when a plurality of devices, including the device, connected to the cable do not present a lower impedance on the cable;
in response to transmitting the second ranging signal, receiving a second response signal; and
determining a baseline impedance based on the second response signal.

12. The method according to claim 11, wherein determining the distance between the time-domain reflectometer and the device based on the baseline impedance includes:
obtaining a difference between the first response signal and the baseline impedance; and
determining the distance based on the difference between the first response signal and the baseline impedance.

13. The method according to claim 10, wherein the first ranging signal is a sequence that is a pseudo random sequence or a maximum length sequence.

14. The method according to claim 13, comprising:
performing correlation on the first response signal to produce a correlation signal; and
determining the distance between the time-domain reflectometer and the device based on the correlation signal.

15. The method according to claim 14, wherein determining the distance between the time-domain reflectometer and the device based on the correlation signal includes:
identifying a peak in the correlation signal and a time instance associated with the peak; and
determining the distance based on the time instance associated with the peak.

16. The method according to claim 15, comprising:
obtaining one or more other correlation signals by performing respective one or more correlations on one or more other response signals;
obtaining a function of the correlation signal and the one or more other correlation signals; and
determining the distance between the time-domain reflectometer and the device based on the function of the correlation signal and the one or more other correlation signals.

17. The method according to claim 16, wherein the function is an average of the correlation signal and the one or more other correlation signals or a sum of the correlation signal and the one or more other correlation signals.

18. A non-transitory computer-readable storage medium having stored thereon executable instructions that, when executed by a processor, cause the processor to:
determine a time when to transmit a first ranging signal over a cable that coincides with a period of time when a device, connected to the cable, both presents a first impedance on the cable that is lower than a second impedance of the cable and does not actively transmit data on the cable;
cause the first ranging signal to be transmitted in accordance with the time;
receive data representative of a first response signal having a peak associated with an impedance mismatch present on the cable resulting from the device presenting the first impedance on the cable that is lower than the second impedance of the cable;
determine, based on the data representative of the first response signal, a distance between a time-domain reflectometer and the device; and
output data representative of the distance.

19. The non-transitory computer-readable storage medium according to claim 18, wherein the executable instructions cause the processor to:
cause a second ranging signal to be transmitted at a time when a plurality of devices, including the device, connected to the cable do not present a lower impedance on the cable;
in response to causing the second ranging signal to be transmitted, receive a second response signal; and
determine a baseline impedance based on the second response signal.

20. The non-transitory computer-readable storage medium according to claim 19, wherein the executable instructions cause the processor to:
  obtain a difference between the first response signal and the baseline impedance; and
  determine the distance based on the difference between the first response signal and the baseline impedance.

* * * * *